United States Patent
Chen et al.

(10) Patent No.: US 10,157,867 B1
(45) Date of Patent: Dec. 18, 2018

(54) INTERCONNECT STRUCTURE AND METHOD

(71) Applicant: Taiwan Semiconductor Manufacturing Company, Ltd., Hsinchu (TW)

(72) Inventors: Ying-Ju Chen, Tuku Township (TW); Chen-Hua Yu, Hsinchu (TW); Ming-Fa Chen, Taichung (TW); Hsien-Wei Chen, Hsinchu (TW); Chih-Chia Hu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/692,067

(22) Filed: Aug. 31, 2017

(51) Int. Cl.
*H01L 23/00* (2006.01)
*H01L 23/532* (2006.01)
*H01L 21/768* (2006.01)
*H01L 23/522* (2006.01)

(52) U.S. Cl.
CPC .......... *H01L 24/06* (2013.01); *H01L 21/7684* (2013.01); *H01L 21/76802* (2013.01); *H01L 23/5226* (2013.01); *H01L 23/53233* (2013.01); *H01L 24/03* (2013.01); *H01L 24/89* (2013.01)

(58) Field of Classification Search
None
See application file for complete search history.

(56) References Cited

U.S. PATENT DOCUMENTS

| | | | |
|---|---|---|---|
| 6,838,774 B2 | 1/2005 | Patti | |
| 7,642,653 B2 | 1/2010 | Kuzuhara et al. | |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,496,189 B2 | 3/2016 | Yu et al. | |
| 9,372,206 B2 | 6/2016 | Wu et al. | |

(Continued)

FOREIGN PATENT DOCUMENTS

| | | |
|---|---|---|
| DE | 102007050610 A1 | 5/2008 |
| TW | 201344890 A | 11/2013 |
| TW | 201542442 A | 11/2015 |

*Primary Examiner* — Eva Y Montalvo
*Assistant Examiner* — Kevin Quinto
(74) *Attorney, Agent, or Firm* — Slater Matsil, LLP

(57) ABSTRACT

In an embodiment, a device includes: an interconnect structure over a substrate, the interconnect structure including a first metal line and a second metal line, the first metal line longer than the second metal line; a surface dielectric layer over the interconnect structure; a plurality of first vias in the surface dielectric layer; a first bonding pad in the surface dielectric layer, where the first bonding pad is connected to a first end of the first metal line through the first vias; a plurality of second vias in the surface dielectric layer; a second bonding pad in the surface dielectric layer, the second bonding pad and the first bonding pad separate from each other, where the second bonding pad is connected to a second end of the first metal line through the second vias; and a third bonding pad in the surface dielectric layer, where the third bonding pad is connect to the second metal line through a third via.

20 Claims, 15 Drawing Sheets

(56) References Cited

U.S. PATENT DOCUMENTS

| | | |
|---|---|---|
| 9,412,725 B2 | 8/2016 | Chen et al. |
| 9,425,126 B2 | 8/2016 | Kuo et al. |
| 9,443,783 B2 | 9/2016 | Lin et al. |
| 9,522,822 B2 | 12/2016 | Cheng et al. |
| 2011/0248404 A1 | 10/2011 | Chiu et al. |
| 2013/0256893 A1* | 10/2013 | Tsai .................... H01L 23/5226 |
| | | 257/758 |

* cited by examiner

INTERCONNECT STRUCTURE AND METHOD

BACKGROUND

In wafer-to-wafer bonding technology, various methods have been developed to bond two package components (such as wafers) together. Some wafer bonding methods include fusion bonding, eutectic bonding, direct metal bonding, hybrid bonding, and the like. In fusion bonding, an oxide surface of a wafer is bonded to an oxide surface or a silicon surface of another wafer. In eutectic bonding, two eutectic materials are placed together, and a high pressure and a high temperature are applied. The eutectic materials are hence melted. When the melted eutectic materials solidify, the wafers bond together. In direct metal-to-metal bonding, two metal pads are pressed against each other at an elevated temperature, and the inter-diffusion of the metal pads causes the bonding of the metal pads. In hybrid bonding, the metal pads of two wafers are bonded to each other through direct metal-to-metal bonding, and an oxide surface of one of the two wafers is bonded to an oxide surface or a silicon surface of the other wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
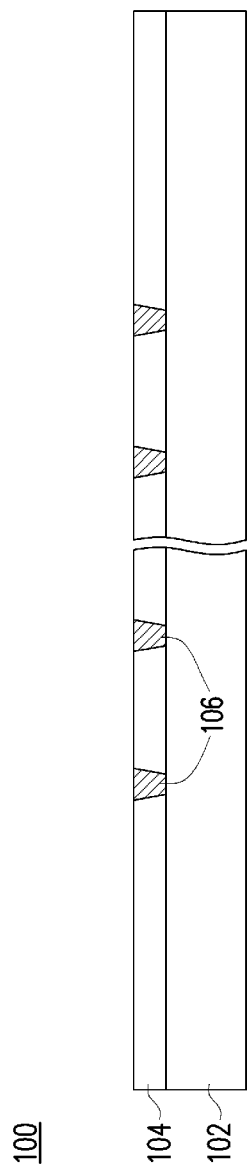
FIGS. 1, 2, 3, 4A, 4B, 5A, 5B, 6A, 6B, and 7 illustrate intermediate stages in the formation of interconnect structures of integrated circuits, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure and method is provided, in accordance with some embodiments. A surface dielectric layer is formed over an interconnect, and bonding pads are formed in the surface dielectric layer. The bonding pads may be connected to metal lines in the interconnect by a plurality of vias. A plurality of vias may be used for bonding pads connected to metal lines that are long (e.g., longer than 800 µm). Using a plurality of vias on bonding pads connected to long metal lines may reduce the formation of defects in subsequent planarization processes.

FIGS. 1, 2, 3, 4A, 4B, 5A, 5B, 6A, 6B, and 7 illustrate intermediate stages in the formation of interconnect structures of integrated circuits, in accordance with some embodiments. FIGS. 1, 2, 3, and 7 are cross-sectional views. FIGS. 4A, 4B, 5A, 5B, 6A, and 6B are cross-sectional and plan views, where figures ending with an "A" designation are cross-sectional views, and figures ending with a "B" designation are plan views taken along a B-B line of the corresponding plan view.

FIG. 1 illustrates wafer 100, which includes a substrate 102 and features formed over the substrate 102. The substrate 102 may be a semiconductor substrate, such as a bulk semiconductor, a semiconductor-on-insulator (SOI) substrate, or the like, which may be doped (e.g., with a p-type or an n-type dopant) or undoped. Generally, a SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the wafer 100 is used to form a device die. In such embodiments, integrated circuit devices are formed on the top surface of the substrate 102. Exemplary integrated circuit devices may include complementary metal-oxide semiconductor (CMOS) transistors, resistors, capacitors, diodes, or the like. The details of the integrated circuit devices are not illustrated herein. In some embodiments, the wafer 100 is used for forming interposers. In such embodiments, no active devices such as transistors or diodes are formed on the substrate 102. There may (or may not) be passive devices such as capacitors, resistors, inductors, or the like formed in the wafer 100. The substrate 102 may also be a dielectric substrate in the embodiments in which the wafer 100 is an interposer. Furthermore, through vias (not shown) may be formed to penetrate through the substrate 102 in order to interconnect components on the opposite sides of the substrate 102.

In FIG. 1, an ILD 104 is formed over the substrate 102. In embodiments where integrated circuit devices are formed on the substrate 102, the ILD 104 fills the space between the gate stacks of transistors (not shown) of the integrated circuit devices. The ILD 104 may be formed from phosphosilicate glass (PSG), borosilicate glass (BSG), boron-doped phosphosilicate glass (BPSG), fluorine-doped silicate glass (FSG), tetraethyl orthosilicate (TEOS), or the like. The ILD 104 may be a layer formed from a low-k dielectric material having a k-value lower than about 3.0. In some embodiments, the ILD 104 is formed using spin coating or the like. In some embodiments, the ILD 104 is formed using a deposition method such as plasma enhanced chemical vapor deposition (PECVD), flowable chemical vapor deposition (FCVD), low pressure chemical vapor deposition (LPCVD), or the like.

Further in FIG. 1, contact plugs 106 are formed in the ILD 104. The contact plugs 106 are electrically connected to the integrated circuit devices of the substrate 102. For example, the contact plugs 106 may be gate contact plugs that are connected to the gate electrodes of transistors (not shown) of the integrated circuit devices, and/or may be source/drain contact plugs that are electrically connected to the source/drain regions of the transistors. Openings for the contact plugs 106 are formed through the ILD 104. The openings may be formed using acceptable photolithography and etching techniques. A liner, such as a diffusion barrier layer, an adhesion layer, or the like may be formed in the openings, and a conductive material may be formed in the openings over the liner. The liner may include titanium, titanium nitride, tantalum, tantalum nitride, or the like. The conductive material may be cobalt, copper, a copper alloy, silver, gold, tungsten, aluminum, nickel, or the like. A planarization process, such as a grinding, chemical-mechanical polish (CMP), or the like may be performed to remove excess material from a surface of ILD 104. The remaining liner and conductive material forms the contact plugs 106 in the openings.

In alternative embodiments, the wafer 100 is an interposer wafer, which is free from active devices therein. The wafer 100 may or may not include passive devices (not shown) such as resistors, capacitors, inductors, transformers, and the like, in accordance with some embodiments.

Figure 2:
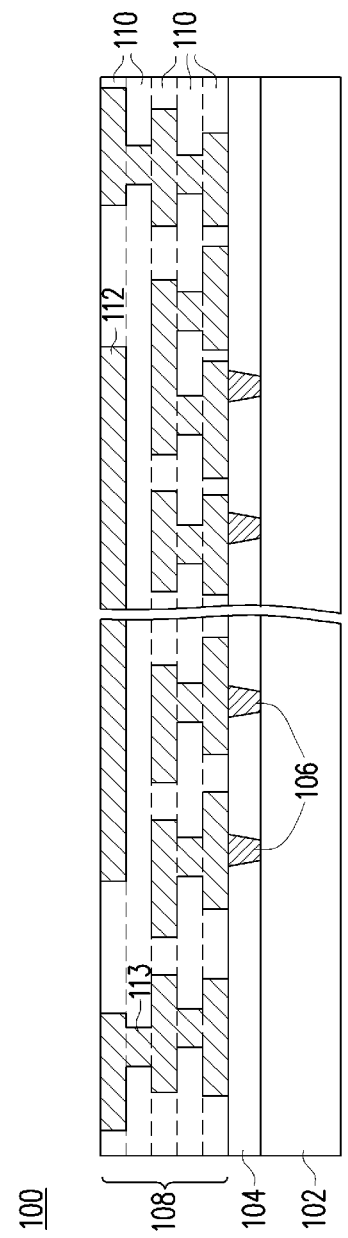

In FIG. 2, an interconnect structure 108 is formed over the contact plugs 106, ILD 104, and integrated circuit devices of the substrate 102 (if any). The interconnect structure 108 includes a plurality of IMD layers 110. A bottommost IMD layer 110 is formed proximate (e.g., immediately above) the substrate 102, a topmost IMD layer 110 is formed distal the substrate 102, and intermediate IMD layers 110 are formed between the bottommost and topmost IMD layers 110. Each of the IMD layers 110 includes metal lines 112 and/or vias 113 formed therein. The metal lines 112 and vias 113 may be electrically connected to the active and/or passive devices of the substrate 102 by the contact plugs 106.

The IMD layers 110 may be formed from a low-k dielectric material having a k-value lower than about 3.0. The IMD layers 110 may be formed from an extra-low-k (ELK) dielectric material having a k-value of less than 2.5. In some embodiments, the IMD layers 110 may be formed from Black Diamond (a registered trademark of Applied Materials), an oxygen-containing and/or carbon containing low-k dielectric material, Hydrogen SilsesQuioxane (HSQ), MethylSilsesQuioxane (MSQ), or the like. In some embodiments, the IMD layers 110 are formed from a porous material such as SiOCN, SiCN, SiOC, SiOCH, or the like, and may be formed by spin-on coating or a deposition process such as plasma enhanced chemical vapor deposition (PECVD), CVD, PVD, or the like.

The interconnect structure 108 may be formed using a single and/or a dual damascene process, a via-first process, or a metal-first process. In an embodiment, the bottommost IMD layer 110 is formed, and openings (not shown) are formed therein using acceptable photolithography and etching techniques. Diffusion barrier layers (not shown) may be formed from TaN, Ta, TiN, Ti, CoW, or the like, and may be formed in the openings by a deposition process such as CVD, ALD, or the like. A conductive material may be formed in the openings from copper, aluminum, nickel, tungsten, cobalt, silver, combinations thereof, or the like, and may be formed over the diffusion barrier layers in the openings by an electro-chemical plating process, CVD, ALD, PVD, the like, or a combination thereof. After formation of the diffusion barrier layers and the conductive material, excess of the diffusion barrier layers and conductive material may be removed from the front side of the wafer 100 by, for example, a planarization process such as CMP, thereby leaving metal lines 112 in the openings of the bottommost IMD layer 110. The process may then be repeated to form the intermediate IMD layers 110 and metal lines 112 and vias 113 therein. The topmost IMD layer 110 and the metal lines 112 formed therein may be formed to have a thickness greater than a thickness of the bottommost and intermediate IMD layers 110.

Some of the metal lines 112 in the interconnect structure 108 may be long. The lengths of the metal lines 112 may be determined by the function of the device dies that the wafer 100 is used to form. In particular, highly integrated devices such as system-on-integrated-circuit (SoIC) architectures may have more metal lines 112 that are long. A metal line 112 may be considered "long" when it is at least 10 times longer than the average length of the metal lines 112. In an embodiment, the long metal lines 112 are longer than about 800 µm, such as from about 900 µm to about 2000 µm. In some embodiments, the long metal lines 112 are electrically connected to the substrate 102. In other embodiments, the long metal lines 112 are dummy lines that are electrically isolated from the substrate 102. As noted above, repeated CMP processes may be used to form the interconnect structure 108. The slurry used by the CMP processes may generate electrochemical potential across the surface being planarized. The electrochemical potential may be generated across long metal lines 112, causing defects during planarization. Such defects may occur with higher frequency at edges of the wafer 100, which are subject to a higher polishing speed and larger electrochemical potential. For device dies that typically have long metal lines 112, the defect rate for metal lines 112 in the topmost IMD layer 110 may be as high as 30% at the edge of the wafer.

Figure 3:
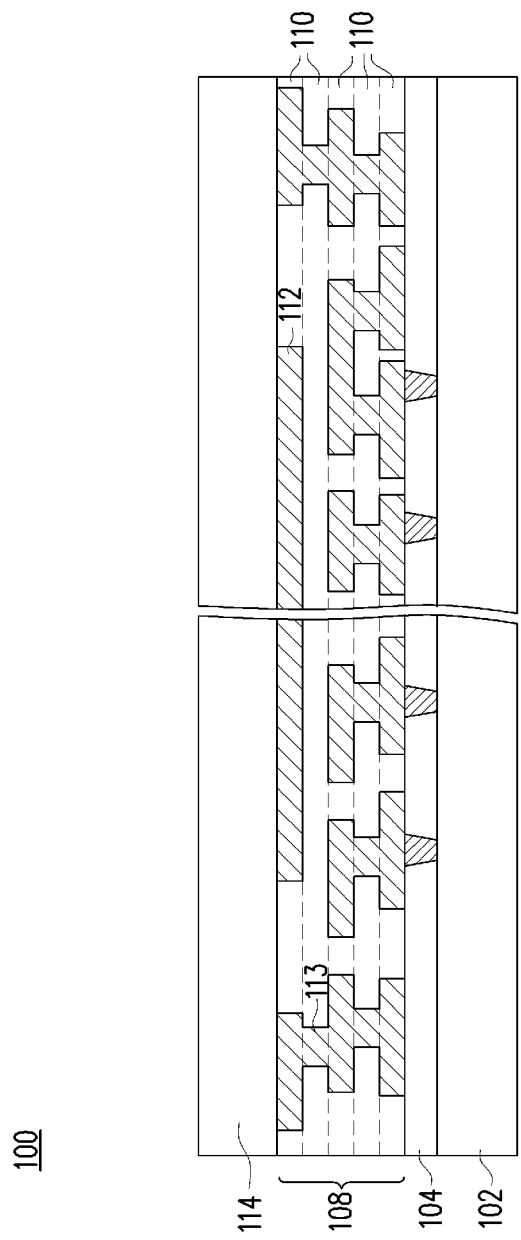

In FIG. 3, a surface dielectric layer 114 is formed over the interconnect structure 108. The surface dielectric layer 114 is a silicon containing dielectric layer, and may be formed of comprise silicon oxide, SiON, SiN, or the like, and may be formed by a deposition process such as CVD, PECVD, PVD, ALD, the like, or a combination thereof. In an embodiment, the surface dielectric layer 114 comprises silicon oxide, and may alternatively be referred to as a "bonding oxide." The surface dielectric layer 114 may be formed to have a thickness greater than a thickness of the topmost IMD layer 110.

Figure 4A:
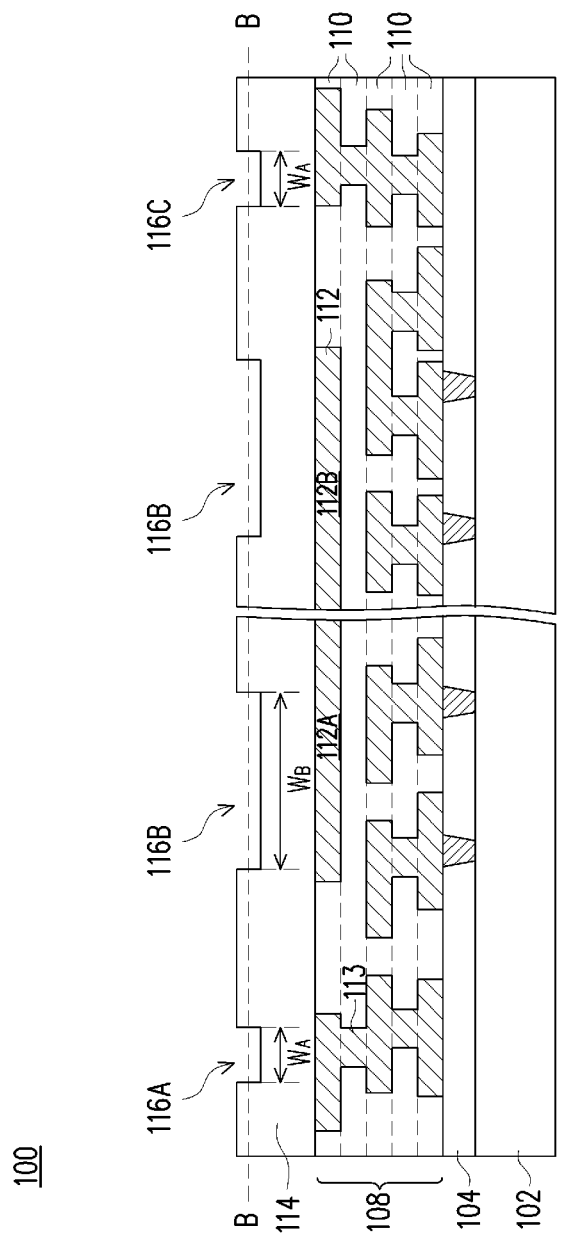
Figure 4B:
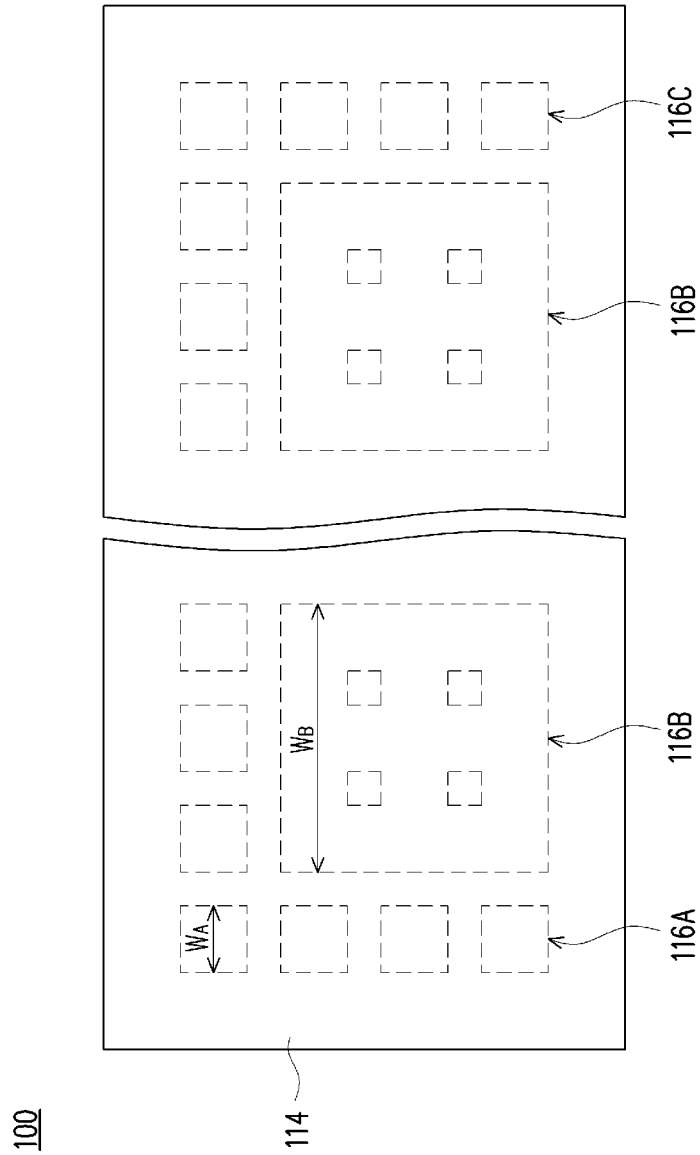

In FIGS. 4A and 4B, pad openings 116 are formed in the surface dielectric layer 114. The pad openings 116 may be formed using acceptable photolithography and etching techniques. The photolithography process may include forming a photoresist (not shown) over the surface dielectric layer 114, patterning the photoresist with openings corresponding to the pad openings 116, extending the pad openings 116 through the photoresist and into the surface dielectric layer 114, and then removing the photoresist. The photoresist may be a single-layer photoresist, a bi-layer photoresist, a tri-layer photoresist, or the like. The etching process is performed such that the pad openings 116 extend from the top of the surface dielectric layer 114 to an intermediate point of the surface dielectric layer 114. Etching the pad openings 116 to such a depth may be performed using a time-mode, and may be stopped after the etching has been performed for a predetermined period of time. Other etch and stop point detection techniques are also contemplated.

The pad openings 116 include small pad openings 116A, large pad openings 116B, and dummy pad openings 116C. The small pad openings 116A and dummy pad openings 116C have a width $W_A$, and the large pad openings 116B have a width $W_B$ greater than the width $W_A$. The pad openings 116 may be formed to be substantially evenly spaced apart. By spacing the pad openings 116 a substantially equal amount apart, the feature density on the wafer 100 may be relatively even across the surface of the wafer 100. This may prevent uneven loading in subsequent processing steps. Further, the width $W_B$ of the large pad openings 116B may be greater than or equal to twice the distance between the pad openings 116 plus the width $W_A$ of the small pad openings 116A. In an embodiment, the width $W_A$ of the small pad openings 116A is less than or equal to about 5 µm. The large pad openings 116B are formed over ends 112A and 112B of the long metal lines 112.

Figure 5A:
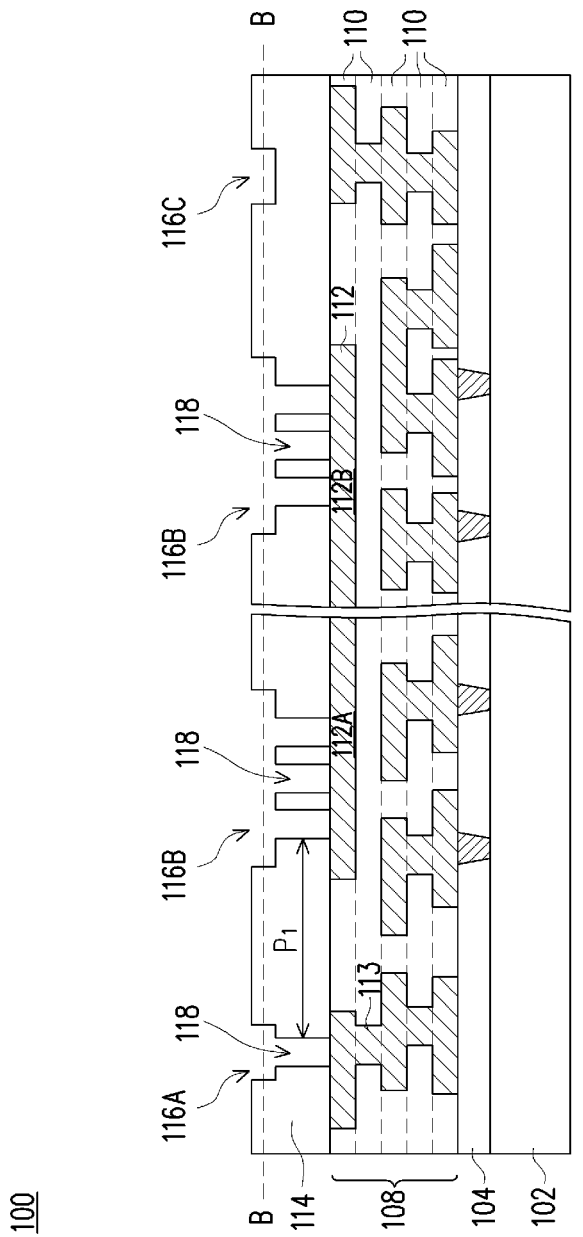
Figure 5B:
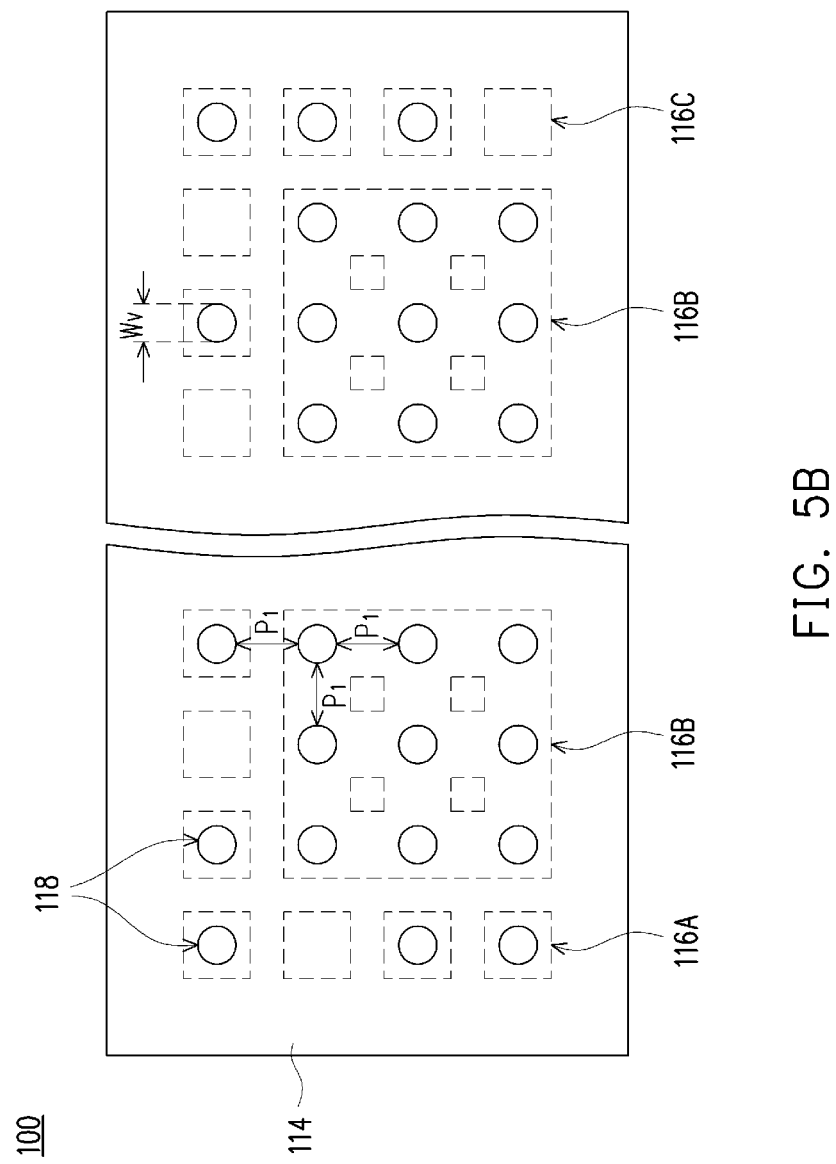

In FIGS. 5A and 5B, via openings 118 are formed in the surface dielectric layer 114. The via openings 118 are formed at the bottom of the pad openings 116, and extend from the bottom of the pad openings 116 to the bottom surface of the surface dielectric layer 114, thereby exposing the long metal lines 112. The via openings 118 may be formed using acceptable photolithography and etching techniques. The photolithography process may include forming a photoresist (not shown) over the surface dielectric layer 114 and in the pad openings 116, patterning the photoresist with openings corresponding to the via openings 118, extending the via openings 118 through the photoresist and the surface dielectric layer 114, and then removing the photoresist. The photoresist may be a single-layer photoresist, a bi-layer photoresist, a tri-layer photoresist, or the like. An etch stop layer (not shown) may be formed between the interconnect structure 108 and the surface dielectric layer 114. In such embodiments, the via openings 118 may expose the etch stop layer (not shown) after formation. Portions of the etch stop layer may then be removed in another etching process to expose the metal lines 112 and vias 113 of the interconnect structure 108. The width of the pad openings 116 is greater than the width of the via openings 118. In an embodiment, the via openings 118 are formed to a width $W_V$ of greater than or equal to about 1 µm, and the difference between the width of the via openings 118 and the width $W_A$ of the small pad openings 116A is greater than or equal to 0.1 µm.

Different quantities of via openings 118 may be formed at the bottoms of the pad openings 116. A single via opening 118 is formed at the bottoms of the small pad openings 116A. A plurality of via openings 118 are formed at the bottoms of the large pad openings 116B. No via openings 118 are formed at the bottoms of the dummy pad openings 116C. The via openings 118 are formed to have a pitch $P_1$. In particular, the pitch of the via openings 118 in the large pad openings 116B and the pitch of the via openings 118 between the small pad openings 116A and the large pad openings 116B have about the same pitch $P_1$. In other words, the via openings 118 each have about the same pitch $P_1$ regardless of whether the vias openings 118 are formed at the bottom of the small pad openings 116A or the large pad openings 116B. Further, the via openings 118 have about the same pitch $P_1$ in both a latitudinal and longitudinal direction along the wafer 100. In an embodiment, the pitch $P_1$ is from about 2 µm to about 20 µm, such as about 10 µm.

Figure 6A:
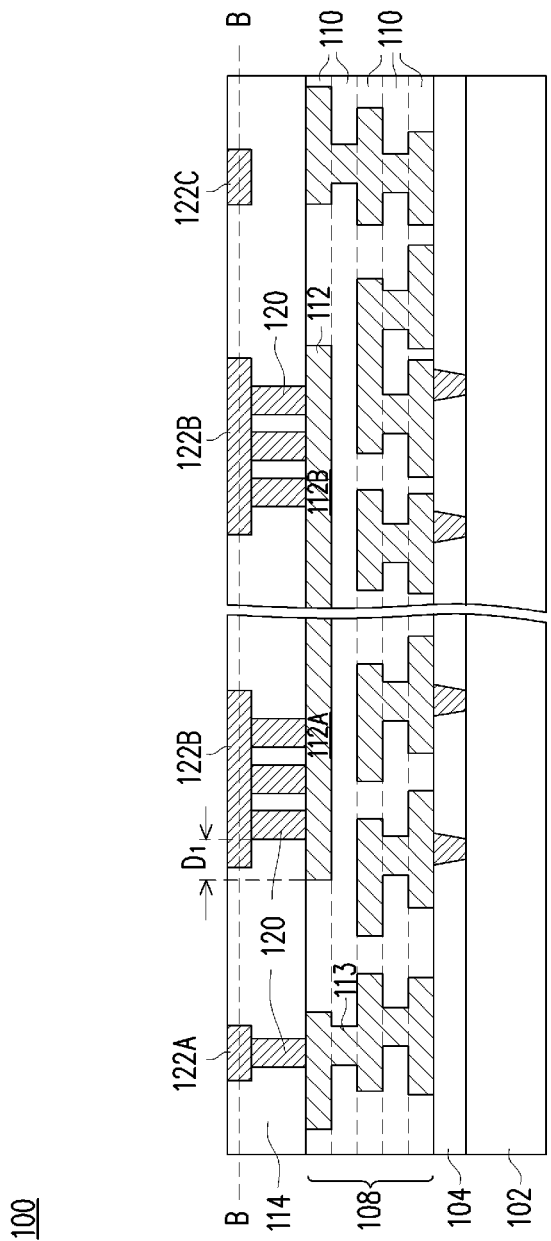
Figure 6B:
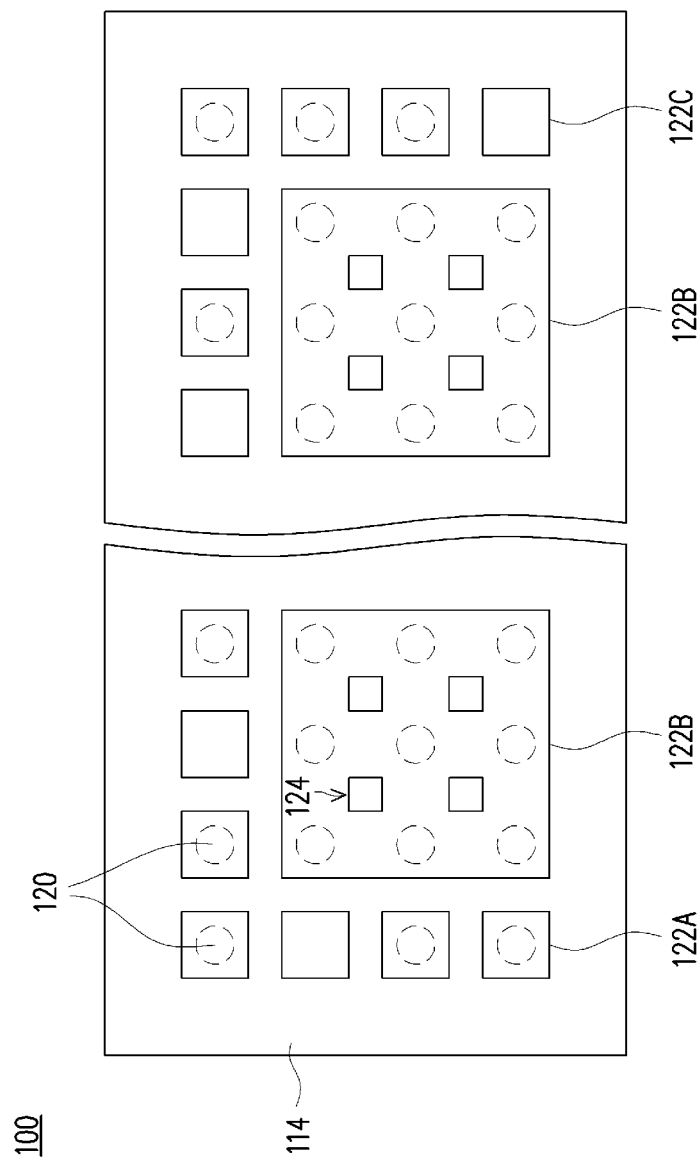

In FIGS. 6A and 6B, vias 120 are formed in the via openings 118 and bonding pads 122 are formed in the pad openings 116. The vias 120 and bonding pads 122 may be formed of a conductive material including a metal or a metal alloy such as copper, silver, gold, tungsten, cobalt, aluminum, or alloys thereof. In some embodiments, the formation of the vias 120 and bonding pads 122 includes depositing a thin seed layer (not shown) in the pad openings 116 and via openings 118, which may include copper or a copper alloy, and filling the rest of the pad openings 116 and via openings 118 using, for example, ECP or electro-less plating. Excess conductive material and the seed layer may be remove from the top surface of the surface dielectric layer 114 using a planarization process such as a CPM. A deposition method may also be contemplated. The bonding pads 122 electrically connect the interconnect structure 108 through the vias 120, and may be referred to as "bond pad metal."

The bonding pads 122 include small bonding pads 122A, large bonding pads 122B, and dummy bonding pads 122C, which, respectively, are formed in the small pad openings 116A, large pad openings 116B, and dummy pad openings 116C. The small bonding pads 122A are connected to the interconnect 108 with a single via 120. The large bonding pads 122B are connected to the interconnect 108 with a plurality of vias 120. The large bonding pads 122B may include openings 124. The openings 124 may have a same size as the gaps between the small bonding pads 122A, extend through the large bonding pads 122B, and may be filled with the material of the surface dielectric layer 114. The dummy bonding pads 122C are not connected to the interconnect 108, and are electrically isolated from the vias 120. As noted above, each of the bonding pads 122 are spaced apart substantially evenly. The dummy bonding pads 122C are formed in unoccupied top portions of the surface dielectric layer 114 so that the even spacing may be maintained.

As noted above, the large bonding pads 122B connect to the long metal lines 112 with multiple vias 120. Because the multiple vias 120 are arranged in parallel, the multiple vias 120 have a lower effective impedance than a single via 120. Reducing the effective impedance of the vias 120 reduces the total impedance between the connected large bonding pads 122B, which may reduce the electrochemical potential generated by the CPM across the long metal lines 112 of the interconnect structure 108. As such, the large bonding pads 122B may be formed for connection to metal lines 112 that have a length greater than a particular value, and may be referred to as redundant bonding pads. For example, in a SoIC architecture device, long metal lines 112 may be lines that are longer than about 800 µm, and so the large bonding pads 122B may be formed at the ends 112A and 112B of the long metal lines 112. The large bonding pads 122B are disposed such that the outermost vias 120 are located a distance $D_1$ from the ends of the long metal lines 112. In an embodiment the distance $D_1$ may be less than about 0.05% of the length of the line metal lines 112, which may provide mechanical strength for the long metal lines 112. In embodiments where the long metal lines 112 are longer than 800 µm, the distance $D_1$ of the outermost vias 120 may be from about 0.3 µm to about 1 µm. The small bonding pads 122A may be formed on metal lines 112 that are shorter than the long metal lines 112.

Figure 7:
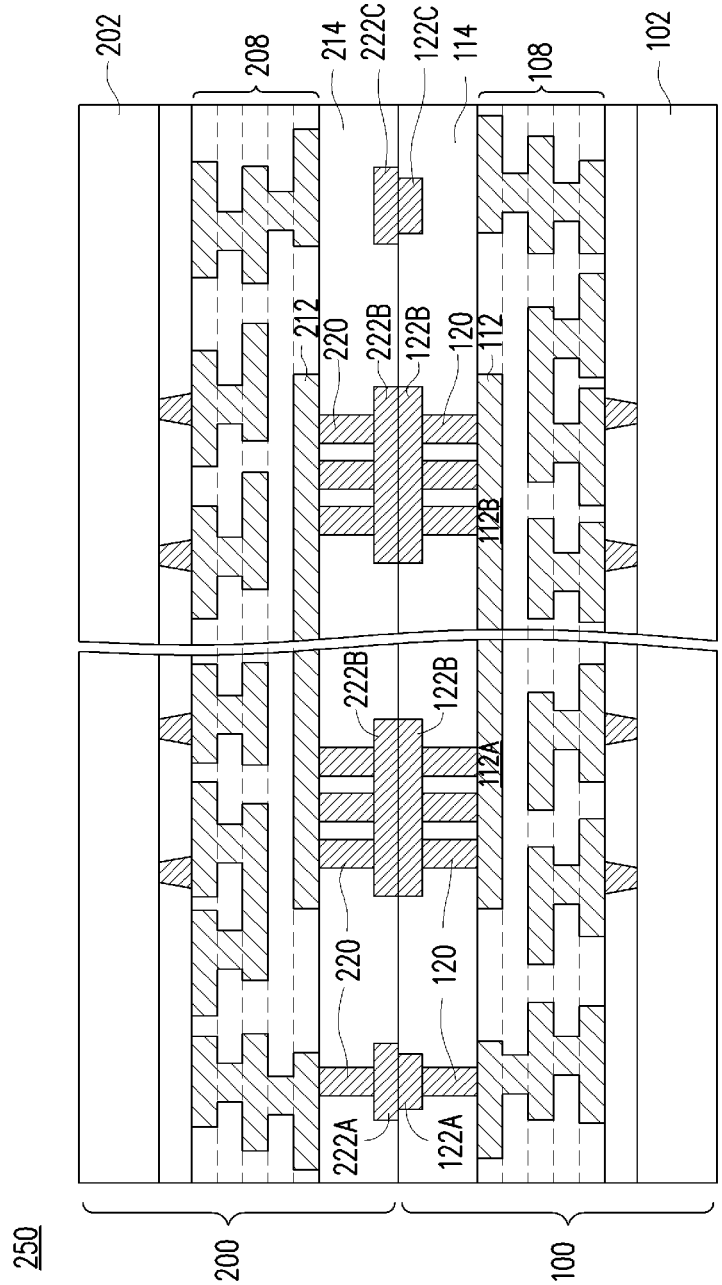

In FIG. 7, the wafer 100 is bonded to a first package component 200 using hybrid bonding. The first package component 200 may be similar to the wafer 100, or may be different. In some embodiments, the first package component 200 includes: a substrate 202; an interconnect 208 having metal lines 212; a surface dielectric layer 214 over the interconnect 208; small bonding pads 222A, large bonding pads 222B, and dummy bonding pads 222C in the surface dielectric layer 214; and vias 220 connecting the bonding pads 222 to the metal lines 212. For example, the first package component 200 may be selected from a device wafer, an interposer wafer, a package substrate, or the like. The bonding pads 222 of the first package component 200 may be wider than the bonding pads 122 of the wafer 100. In an embodiment, the bonding pads 222 of the first package component 200 have a width that is greater than the width of the bonding pads 122 of the wafer 100 by at least 0.5 µm.

Before performing the bonding, a surface treatment may be performed on the wafer 100 and first package component 200. In some embodiments, the surface treatment includes a plasma treatment. The plasma treatment may be performed in a vacuum environment (e.g., a vacuum chamber, not shown). The process gas used for generating the plasma may be a hydrogen-containing gas, which includes a first gas including hydrogen ($H_2$) and argon (Ar), a second gas including $H_2$ and nitrogen ($N_2$), or a third gas including $H_2$ and helium (He). Through the treatment, the number of OH groups at the top of the surface dielectric layers 114 and 214 increases, which may help form strong fusion bonds. Furthermore, the hydrogen helps reduce or remove metal oxides that may have formed on the surfaces of the bonding pads 122 and 222 during processing. The plasma treatment may also be performed using pure or substantially pure $H_2$, Ar, or $N_2$ as the process gas, which treats the surfaces of the bonding pads 122 and 222 and the surface dielectric layers 114 and 214 through reduction and/or bombardment. The wafer 100 and first package component 200 may be treated with the same surface treatment process, or with different surface treatment processes. In some embodiments, the wafer 100 and/or the first package component 200 may be cleaned after the surface treatment. Cleaning may include performing a chemical cleaning and a de-ionized water cleaning/rinse.

Next, a pre-bonding process may be performed with the wafer 100 and first package component 200. The wafer 100 and first package component 200 are aligned, with the bonding pads 122 of the wafer 100 being aligned to the bonding pads 222 of the first package component 200. In particular, the small bonding pads 122A of the wafer 100 and the small bonding pads 222A of the first package component 200 are aligned; the large bonding pads 122B of the wafer 100 and the large bonding pads 222B of the first package component 200 are aligned; and the dummy bonding pads 122C of the wafer 100 and the dummy bonding pads 222C of the first package component 200 are aligned. After the alignment, the wafer 100 and first package component 200 are pressed against each other. The pressing force may be less than about 5 Newtons per die in some embodiments, although a greater or smaller force may also be used. The pre-bonding process may be performed at room temperature (e.g., at a temperature of from about 21° C. to about 25° C.), although higher temperatures may be used. The pre-bonding time may be shorter than about 1 minute, for example.

After the pre-bonding, the surface dielectric layer 114 of the wafer 100 and the surface dielectric layer 214 of the first package component 200 are bonded to each other. The wafer 100 and first package component 200 in combination are referred to as a bonded pair 250 hereinafter. The bond of the bonded pair 250 is strengthened in a subsequent annealing step. The bonded pair 250 may be annealed at a temperature of from about 300° C. to about 400° C., for example. The annealing may be performed for a period of time of from about 1 hour to about 2 hours, for example. When the temperature rises, the OH bonds in the top of the surface dielectric layers 114 and 214 break to form strong Si—O—Si bonds, and hence the bond between the wafer 100 and first package component 200 is strengthened through fusion bonds. In addition, during the annealing, metals in the bonding pads 122 and 222 (e.g., copper) diffuse to each other so that metal-to-metal bonds are also formed. Hence, the resulting bonds between the wafer 100 and first package component 200 are hybrid bonds.

Figure 8:
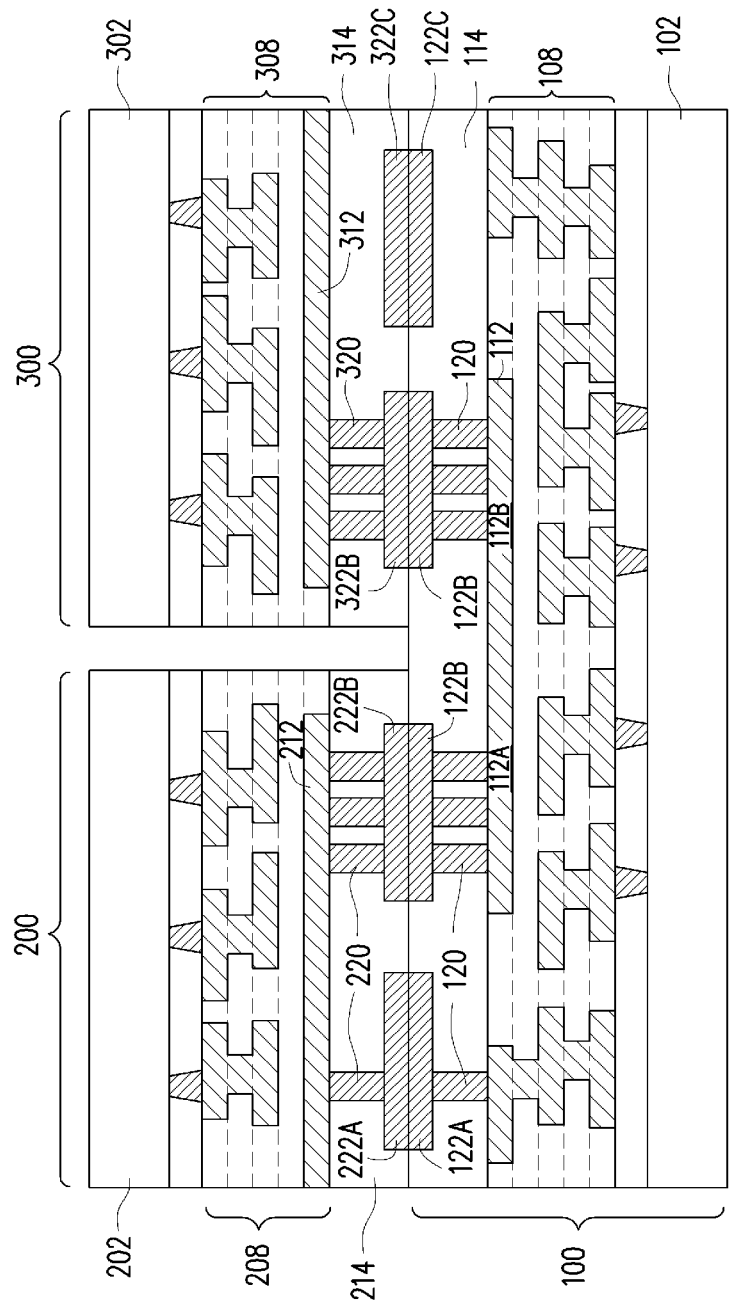
FIG. 8 illustrates an interconnect structure for integrated circuits, in accordance with some embodiments.

FIG. 8 illustrates an interconnect structure for integrated circuits, in accordance with some embodiments. In the embodiment shown in FIG. 8, the first package component 200 and a second package component 300 are bonded to the wafer 100. The second package component 300 may be similar to the wafer 100, or may be different. In some embodiments, the second package component 300 includes: a substrate 302; an interconnect 308 having metal lines 312; a surface dielectric layer 314 over the interconnect 308; large bonding pads 322B and dummy bonding pads 322C in the surface dielectric layer 314; and vias 320 connecting the bonding pads 222 to the metal lines 212. For example, the second package component 300 may be selected from a device wafer, an interposer wafer, a package substrate, or the like. The first package component 200 and second package component 300 are laterally spaced apart such that they are physically separated.

The large bonding pads 222B and 322B of the first package component 200 and second package component 300 are bonded to the large bonding pads 122B of the wafer 100. In an embodiment, a long metal line 112 of the wafer 100 couples the first package component 200 to the second package component 300, with each bond including corresponding large bonding pads 222B and 322B of the long metal lines 212 and 312 of each package component.

Figure 9A:
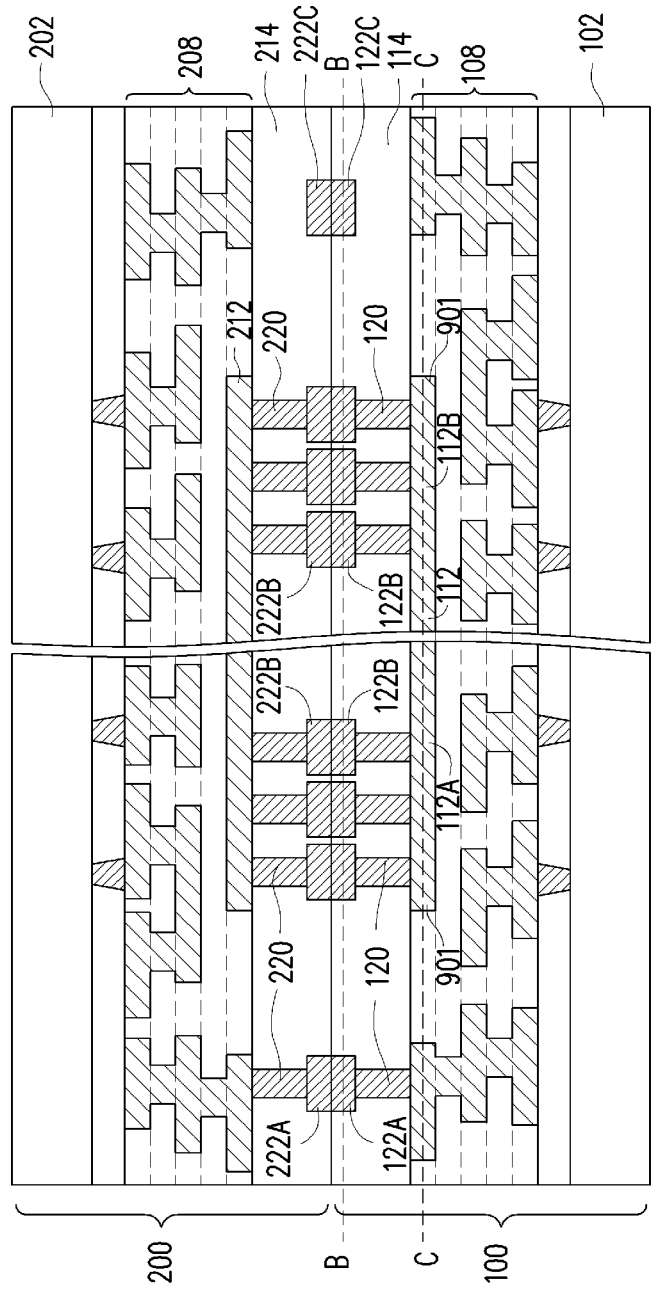
FIGS. 9A, 9B, and 9C illustrate an interconnect structure for integrated circuits, in accordance with some embodiments.
Figure 9B:
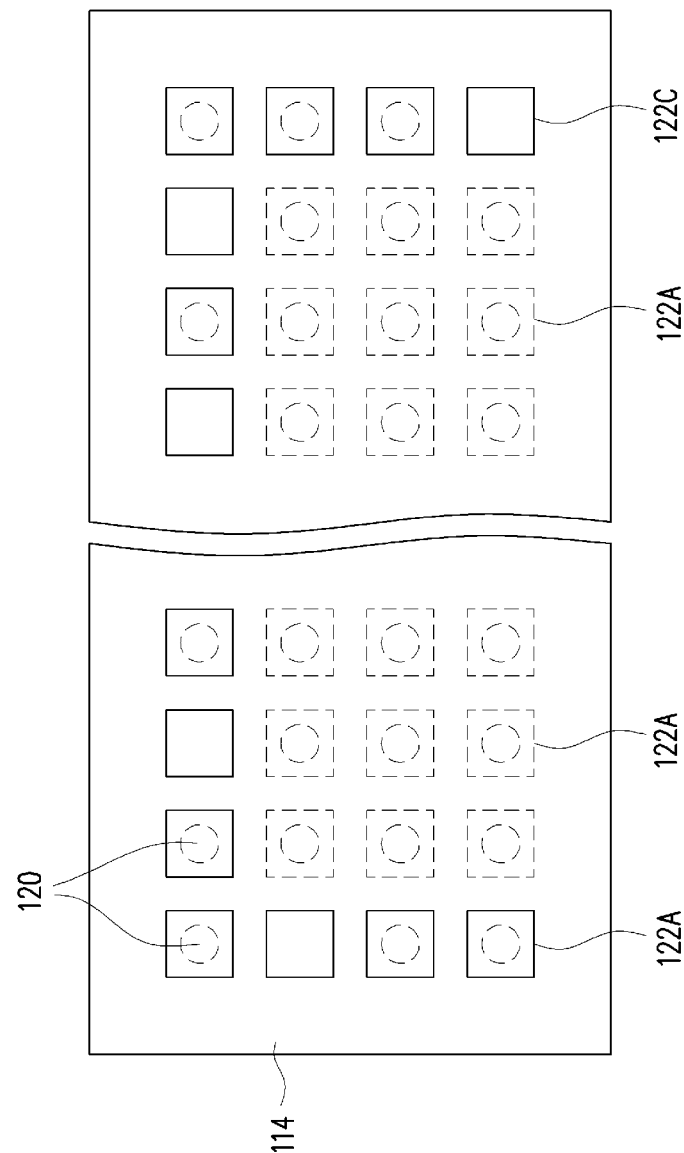
Figure 9C:
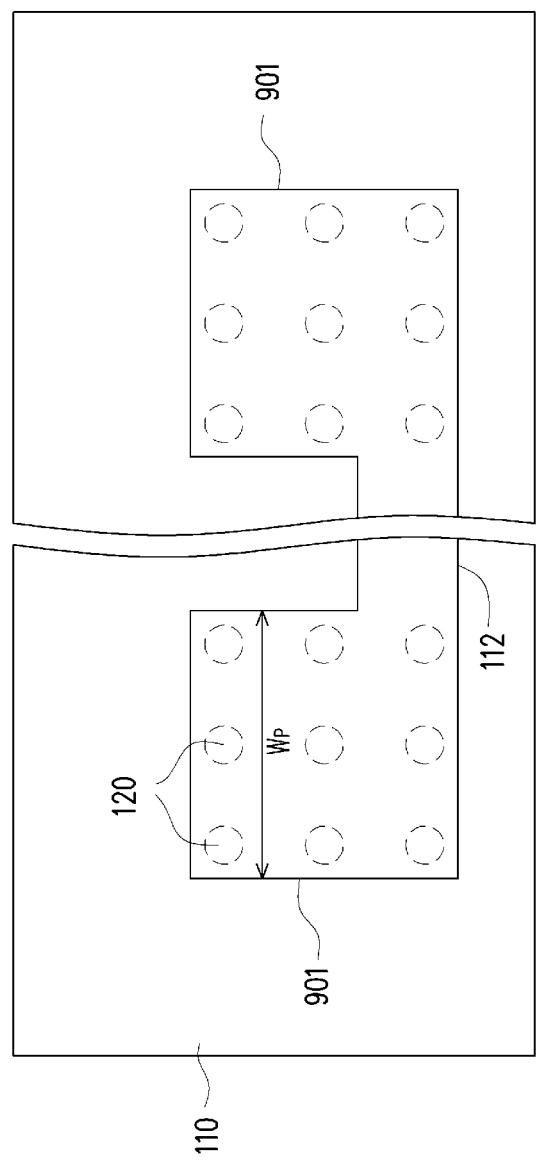

FIGS. 9A, 9B, and 9C illustrate an interconnect structure for integrated circuits, in accordance with some embodiments. FIG. 9A is a cross-sectional view of the wafer 100, FIG. 9B is a plan view taken along the B-B line of FIG. 9A, and FIG. 9C is a plan view taken along the C-C line of FIG. 9A. In the embodiment shown in FIGS. 9A and 9B, the large bonding pads 122B are replaced with a plurality of small bonding pads 122A. A plurality of vias 120 and corresponding small bonding pads 122A are connected to the ends of the long metal lines 112. The long metal lines 212 have pads 901 at the ends of the long metal lines 212, which are coupled to each of the plurality of small bonding pads 122A with the vias 120. The pads 901 have a width $W_P$ that is sufficient to accommodate at least two of the vias 120. For example, the width $W_P$ may be at least an integer multiple of the pitch $P_1$. The long metal lines 212 may be formed with a photolithography and etching technique, where the top IMD layer 110 of the interconnect 108 is patterned with the pads 901 at the ends 112A and 112B of the long metal lines 112, and then filled with conductive material to form the long metal lines 212.

Figure 10A:
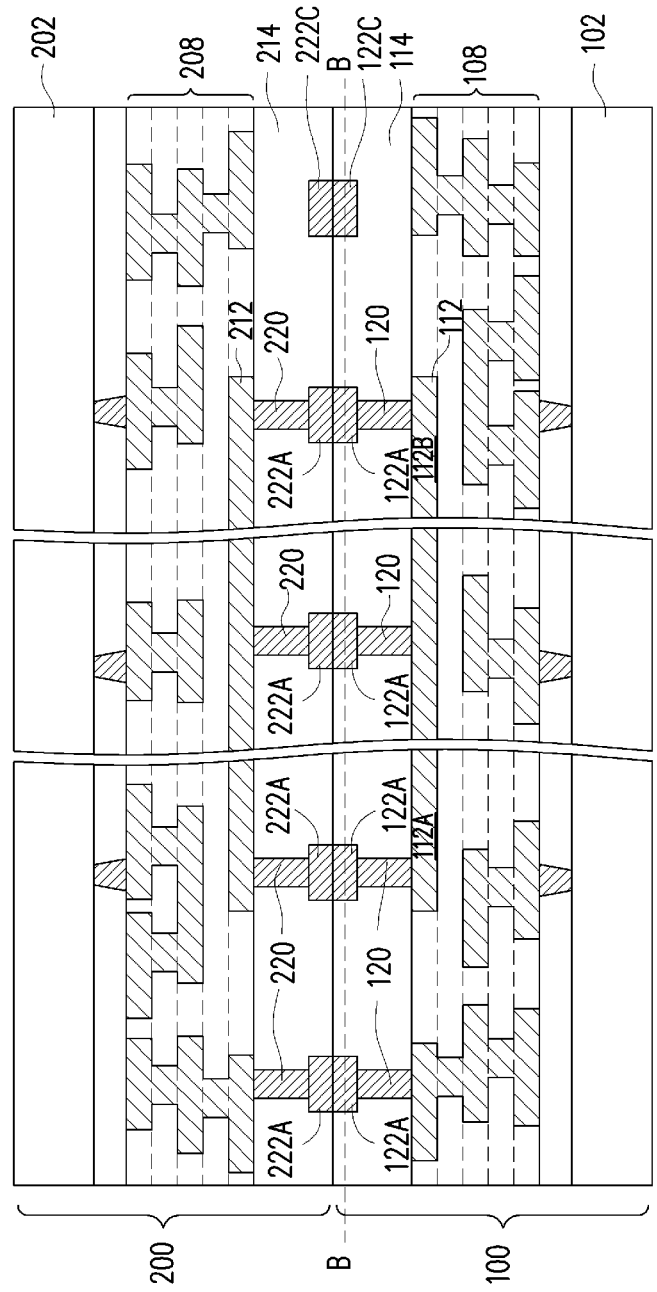
FIGS. 10A and 10B illustrate an interconnect structure for integrated circuits, in accordance with some embodiments.
Figure 10B:
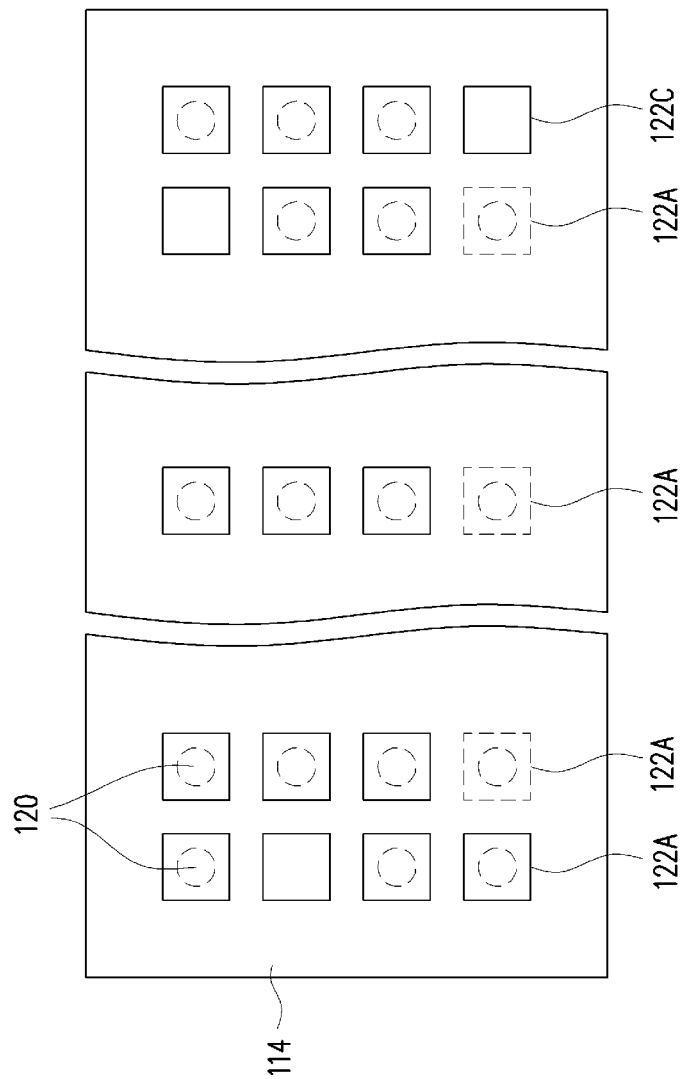

FIGS. 10A and 10B illustrate an interconnect structure for integrated circuits, in accordance with some embodiments.

FIG. 10A is a cross-sectional view of the wafer 100, and FIG. 10B is a plan view taken along the B-B line of FIG. 10A. In the embodiment shown in FIGS. 10A and 10B, the large bonding pads 122B are not used. Instead, a via 120 and corresponding small bonding pad 122A is connected to each of the ends 112A and 112B of the long metal lines 112. Intermediate vias 120 and small bonding pads 122A are formed to support the long metal lines 112.

Embodiments may achieve advantages. Using redundant bonding pads (e.g., large bonding pads 122B with multiple vias 120) for the long metal lines 112 of the interconnect structure 108 may decrease the amount of defects when forming the large bonding pads 122B, particularly for bonding pads 122 that may be subject to large electrochemical potential during CMP. In an experiment, the defect rate of the large bonding pads 122B at the edge of the wafer 100 was decreased from about 30% to about 1% when redundant bonding pads were used for the long metal lines 112.

In an embodiment, a device includes: an interconnect structure over a substrate, the interconnect structure including a first metal line and a second metal line, the first metal line longer than the second metal line; a surface dielectric layer over the interconnect structure; a plurality of first vias in the surface dielectric layer; a first bonding pad in the surface dielectric layer, where the first bonding pad is connected to a first end of the first metal line through the first vias; a plurality of second vias in the surface dielectric layer; a second bonding pad in the surface dielectric layer, the second bonding pad and the first bonding pad separate from each other, where the second bonding pad is connected to a second end of the first metal line through the second vias; and a third bonding pad in the surface dielectric layer, where the third bonding pad is connect to the second metal line through a third via.

In some embodiments, the first vias are spaced apart by a first pitch, the second vias are spaced apart by a second pitch, and the third via is spaced apart from adjacent vias by a third pitch, and where the first pitch, the second pitch, and the third pitch are equal. In some embodiments, the third bonding pad is connect to the second metal line with only the third via. In some embodiments, the first metal line is a dummy line. In some embodiments, the first metal line has a first length, the second metal line has a second length, and the first length is ten times the second length. In some embodiments, the first metal line is greater than 800 m in length, and the second metal line is less than 800 m in length. In some embodiments, the device further includes: a fourth bonding pad in the surface dielectric layer, where the fourth bonding pad is electrically isolated from the interconnect structure. In some embodiments, the first bonding pad, the second bonding pad, the third bonding pad, and the fourth bonding pad are spaced apart by a same pitch. In some embodiments, the first bonding pad and the second bonding pad include openings extending through the first bonding pad and the second bonding pad.

In an embodiment, a method includes: forming a first metal line in a first interconnect structure; depositing a surface dielectric layer over the first interconnect structure; etching a first bonding pad opening in the surface dielectric layer over a first end of the first metal line; etching a second bonding pad opening in the surface dielectric layer over a second end of the first metal line; etching a plurality of via openings in the surface dielectric layer, a first subset of the via openings extending from a bottom of the first bonding pad opening to the first metal line, a second subset of the via openings extending from a bottom of the second bonding pad opening to the first metal line; and filling the via openings, the first bonding pad opening, and the second bonding pad with a conductive material.

In some embodiments, the method further includes: planarizing the conductive material such that a surface of the surface dielectric layer is level with top surfaces of the conductive material. In some embodiments, the method further includes: forming a second metal line in the first interconnect structure, the first metal line longer than the second metal line. In some embodiments, the method further includes: etching a third bonding pad opening in the surface dielectric layer over the second metal line, where a third subset of the via openings extending from a bottom of the third bonding pad opening to the second metal line; and filling the third bonding pad opening with the conductive material. In some embodiments, the first metal line is greater than 800 m in length, and the second metal line is less than 800 m in length. In some embodiments, each of the vias openings are spaced apart a same pitch. In some embodiments, the method further includes: bonding a first package component to the surface dielectric layer, the first bonding pad, and the second bonding pad. In some embodiments, the method further includes: bonding a first package component to the surface dielectric layer and the first bonding pad; and bonding a second package component to the surface dielectric layer and the second bonding pad, the first package and the second package being laterally spaced apart.

In an embodiment, a method includes: depositing an inter-layer dielectric (ILD) over a substrate; forming contact plugs in the ILD; depositing an inter-metal dielectric (IMD) over the contact plugs; forming a metal line in the IMD, the metal line having a first pad at a first end and a second pad at a second end; depositing a surface dielectric layer over the metal line; and forming a plurality of vias in the surface dielectric layer, a first subset of the vias electrically connected to the first pad of the metal line, a second subset of the vias electrically connected to the second pad of the metal line.

In some embodiments, the method further includes: forming a first bonding pad in the surface dielectric layer, where the first bonding pad is connected to the first pad of the metal line through the first subset of the vias; and forming a second bonding pad in the surface dielectric layer, where the second bonding pad is connected to the second pad of the metal line through the second subset of the vias. In some embodiments, the method further includes: forming a plurality of bonding pads in the surface dielectric layer, where a first subset of the plurality of bonding pads are connected to the first pad of the metal line through the first subset of the vias, and where a second subset of the plurality of bonding pads are connected to the second pad of the metal line through the second subset of the vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
an interconnect structure over a substrate, the interconnect structure comprising a first metal line and a second metal line, the first metal line longer than the second metal line;
a surface dielectric layer over the interconnect structure;
a plurality of first vias in the surface dielectric layer;
a first bonding pad in the surface dielectric layer, wherein the first bonding pad is connected to a first end of the first metal line through the first vias;
a plurality of second vias in the surface dielectric layer;
a second bonding pad in the surface dielectric layer, the second bonding pad and the first bonding pad separate from each other, wherein the second bonding pad is connected to a second end of the first metal line through the second vias; and
a third bonding pad in the surface dielectric layer, wherein the third bonding pad is connected to the second metal line through a third via.

2. The device of claim 1, wherein the first vias are spaced apart by a first pitch, the second vias are spaced apart by a second pitch, and the third via is spaced apart from adjacent vias by a third pitch, and wherein the first pitch, the second pitch, and the third pitch are equal.

3. The device of claim 1, wherein the third bonding pad is connect to the second metal line with only the third via.

4. The device of claim 1, wherein the first metal line is a dummy line.

5. The device of claim 1, wherein the first metal line has a first length, the second metal line has a second length, and the first length is ten times the second length.

6. The device of claim 1, wherein the first metal line is greater than 800 µm in length, and the second metal line is less than 800 µm in length.

7. The device of claim 1, further comprising:
a fourth bonding pad in the surface dielectric layer, wherein the fourth bonding pad is electrically isolated from the interconnect structure.

8. The device of claim 7, wherein the first bonding pad, the second bonding pad, the third bonding pad, and the fourth bonding pad are spaced apart by a same pitch.

9. The device of claim 1, wherein the first bonding pad and the second bonding pad comprise openings extending through the first bonding pad and the second bonding pad.

10. A method comprising:
forming a first metal line in a first interconnect structure;
depositing a surface dielectric layer over the first interconnect structure;
etching a first bonding pad opening in the surface dielectric layer over a first end of the first metal line;
etching a second bonding pad opening in the surface dielectric layer over a second end of the first metal line;
etching a plurality of via openings in the surface dielectric layer, a first subset of the via openings extending from a bottom of the first bonding pad opening to the first metal line, a second subset of the via openings extending from a bottom of the second bonding pad opening to the first metal line; and
filling the via openings, the first bonding pad opening, and the second bonding pad with a conductive material.

11. The method of claim 10, further comprising:
planarizing the conductive material such that a surface of the surface dielectric layer is level with top surfaces of the conductive material.

12. The method of claim 10, further comprising:
forming a second metal line in the first interconnect structure, the first metal line longer than the second metal line.

13. The method of claim 12, further comprising:
etching a third bonding pad opening in the surface dielectric layer over the second metal line, wherein a third subset of the via openings extending from a bottom of the third bonding pad opening to the second metal line; and
filling the third bonding pad opening with the conductive material.

14. The method of claim 12, wherein the first metal line is greater than 800 µm in length, and the second metal line is less than 800 µm in length.

15. The method of claim 10, wherein each of the vias openings are spaced apart a same pitch.

16. The method of claim 10, further comprising:
bonding a first package component to the surface dielectric layer, the first bonding pad, and the second bonding pad.

17. The method of claim 10, further comprising:
bonding a first package component to the surface dielectric layer and the first bonding pad; and
bonding a second package component to the surface dielectric layer and the second bonding pad, the first package component and the second package component being laterally spaced apart.

18. A method comprising:
depositing an inter-layer dielectric (ILD) over a substrate;
forming contact plugs in the ILD;
depositing an inter-metal dielectric (IMD) over the contact plugs;
forming a metal line in the IMD, the metal line having a first pad at a first end and a second pad at a second end;
depositing a surface dielectric layer over the metal line; and
forming a plurality of vias in the surface dielectric layer, a first subset of the vias electrically connected to the first pad of the metal line, a second subset of the vias electrically connected to the second pad of the metal line.

19. The method of claim 18, further comprising:
forming a first bonding pad in the surface dielectric layer, wherein the first bonding pad is connected to the first pad of the metal line through the first subset of the vias; and
forming a second bonding pad in the surface dielectric layer, wherein the second bonding pad is connected to the second pad of the metal line through the second subset of the vias.

20. The method of claim 18, further comprising:
forming a plurality of bonding pads in the surface dielectric layer, wherein a first subset of the plurality of bonding pads are connected to the first pad of the metal line through the first subset of the vias, and wherein a second subset of the plurality of bonding pads are connected to the second pad of the metal line through the second subset of the vias.

* * * * *